United States Patent [19]

Sayliss

[11] Patent Number: 4,807,035
[45] Date of Patent: Feb. 21, 1989

[54] SIGNAL MEASUREMENT

[75] Inventor: Leigh S. Sayliss, Lemsford, United Kingdom

[73] Assignee: Marconi Instruments Limited, St. Albans, United Kingdom

[21] Appl. No.: 72,366

[22] Filed: Jul. 13, 1987

[30] Foreign Application Priority Data

Jul. 12, 1986 [GB] United Kingdom ............... 8617024

[51] Int. Cl.⁴ .............................................. H04N 5/52
[52] U.S. Cl. .................................. 358/174; 358/177; 455/246; 455/239; 340/723; 330/129
[58] Field of Search ................ 358/174, 177, 137, 10, 358/99; 455/246, 239; 364/571, 485, 191; 360/10.3, 347 AD; 340/722, 723, 731, 870.42, 870.43; 330/129, 279

[56] References Cited

U.S. PATENT DOCUMENTS

| | | | |
|---|---|---|---|
| 3,628,362 | 12/1986 | Waehner | 358/174 |
| 4,016,557 | 4/1977 | Zitelli et al. | 340/347 AD |
| 4,247,789 | 1/1981 | Cate et al. | 330/260 |
| 4,263,560 | 4/1981 | Ricker | 330/129 |
| 4,270,142 | 5/1981 | Mackelburg et al. | 358/99 |
| 4,517,526 | 5/1985 | Di Crico | 330/129 |
| 4,546,326 | 10/1985 | Van Uffelen et al. | 330/129 |
| 4,630,117 | 12/1986 | Parker | 358/177 |
| 4,682,087 | 7/1987 | Kikuchi | 358/177 |
| 4,692,912 | 9/1987 | Mueller et al. | 367/190 |

FOREIGN PATENT DOCUMENTS 2060183 4/1981 United Kingdom .

Primary Examiner—James J. Groody
Assistant Examiner—John K. Peng
Attorney, Agent, or Firm—Spencer & Frank

[57] ABSTRACT

Apparatus for measuring the noise present in a video signal is adapted to operate on a spare line of the video field. An AGC circuit is used in which a known amount of gain is applied to the input signal and compared with the reference signal. A feedback loop includes a PROM containing data indicative of the antilog of all possible difference signals and applies the antilog data as feedback data to the gain control.

13 Claims, 2 Drawing Sheets

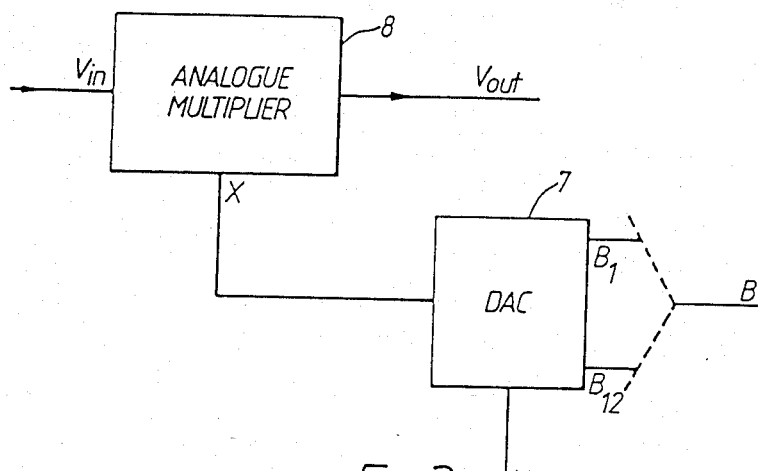
FIG.2.
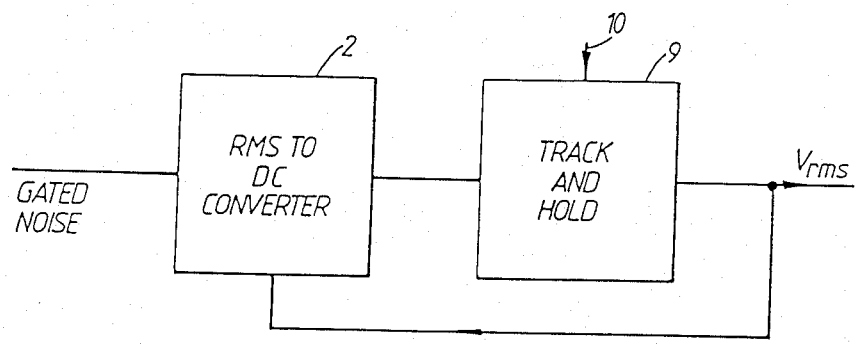
FIG.3.
FIG.4.

SIGNAL MEASUREMENT

BACKGROUND OF THE INVENTION

This invention relates to signal measurement. In particular it relates to a method and apparatus for measuring the noise present in a television or video signal.

It is often required to measure the r.m.s. level of noise present in a television signal. The television signal comprises a number of lines which are scanned in a raster pattern to obtain a field, two fields being interlaced to form a complete picture. The picture is refreshed for instance 50 times per second. Noise still generally be present on each of the lines forming the raster. Generally, in a television broadcast, the picture signal will be transmitted on most of the lines in a field, and information such as test signals or teletext information may be transmitted on some of the remaining lines. One or more lines are usually left spare, however. It is desirable to measure the noise level on part or the whole of a spare line since a true value for the amount of noise will be obtained unaffected by broadcast signals. In a typical 625 line system, the time taken to scan one line is approximately 64 microsecond. This period represents the maximum possible time during which noise measuring apparatus must function to obtain measurement of the noise level, although the measurement may be repeated at the same point in every scan, i.e, every fiftieth of a second. Noise measuring apparatus must therefore be gated to only take measurements at an appropriate time and must have fast reaction times. The noise which it is desired to measure lies within a frequency band from say 200kHz to around 8 MHz, therefore the measuring apparatus should have a wide frequency response.

It is known to directly measure noise levels by using a high speed analogue to digital converter and a microprocessor to calculate r.m.s. level. Such apparatus is difficult to implement and is limited in the frequency and dynamic ranges it can cope with.

A more practical approach is to use an automatic gain control, AGC, loop to set the level of noise to a constant level. The gain of the loop is initially unknown and is measured by feeding a signal of known r.m.s. level into the loop and subsequently sampling to find the change in amplitude of the known signal. Such systems are prone to error and measurements may need to be taken over several fields of the video signal to obtain an accurate result.

SUMMARY OF THE INVENTION

According to the present invention, there is provided signal measurement apparatus comprising: means for applying gain to an input signal; means for comparing the resulting signal with a known reference level and to provide an output depending upon the polarity of the difference between them; and a feedback loop for altering the gain applied to the input signal; the feedback loop including a counter adapted to count up or down if the gained signal level is lower or higher than the reference level, a memory element for storing data indicative of values of a chosen transfer function, and means for selecting a value from the memory element according to the current count of the counter and for altering the gain by an amount related to this value; the apparatus being adapted to provide an output signal indicative of the count of the counter.

The signal to be measured may be a noise signal, particularly the noise present on a raster scanned video signal and may be gated such that a portion or the whole of one or more chosen lines of the video signal are periodically measured.

In order to measure noise, the apparatus includes an r.m.s. to d.c. converter in the input signal path which preferably includes a track and hold circuit so that a value can be held in the counter between gated periods, thus eliminating the delays involved in having to count from zero at the beginning of each new gated period.

Preferably, for reasons described below, the transfer function is an antilog function, although other functions may be desirable as appropriate.

The apparatus may also include a fast/slow control together with means for determining whether the r.m.s. level of the noise or other signal is more than a certain amount greater than the reference level and if so, to set the fast/slow control to count at a faster rate.

In a second aspect, the invention provides a method of signal measurement including the steps of: applying gain to an input signal; clocking a counter to count up or down if the resulting signal level is lower or higher than a known reference level; using the count to select a chosen value from a plurality of values indicative of a chosen transfer function stored in a memory element and applying the chosen value as a negative feedback signal to alter the gain; repeating those steps so that an equilibrium state is reached at which the gained input signal is substantially equal to the reference level; and deriving a value for the signal level of the input signal from the count on the counter.

In preferred embodiments of the invention, the equilibrium state automatically alters to track changes in the input signal level.

BRIEF DESCRIPTION OF THE INVENTION

Embodiments of the invention will now be described, by way of example only, with reference to the accompanying drawings in which:

FIG. 2 shows apparatus which may be used as the gain circuit of the apparatus of FIG. 1.

FIG. 3 shows apparatus which may be used as the r.m.s. to d.c. converter of the apparatus of FIG. 1.

FIG. 4 shows signals which may typically be associated with the apparatus of FIG. 3.

DETAILED DESCRIPTION OF THE PREFERRED EMBODIMENT

Figure 1:
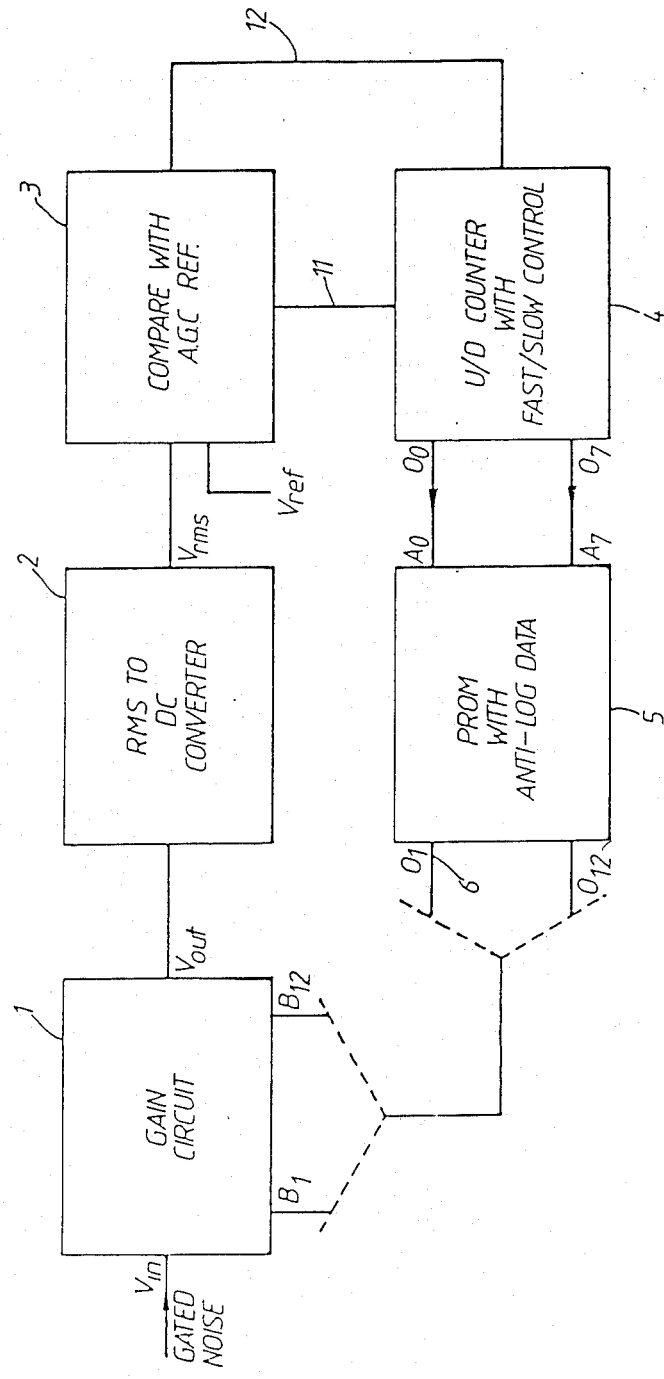
FIG. 1 is a block diagram showing apparatus adapted to perform the invention.

Referring to FIG. 1, the apparatus includes a gain circuit 1 for setting its output voltage $V_{out}$ to a level determined by both the input voltage $V_{in}$ and also by a digital input $B_1$ to $B_{12}$. The apparatus also includes a r.m.s. to d.c. converter 2 which feeds a signal indicative of the r.m.s. value of the voltage, $V_{rms}$, to a circuit 3 which compares signal $V_{rms}$ with a known reference signal $V_{ref}$. Output from comparing circuit 3, which may for example include a comparator, is fed to an up/down counter 4 which further includes a fast/slow control as will be further described. A digital signal $A_0$ to $A_7$ from the up/down counter 4 is applied to a PROM 5 which takes the antilog 6 of the output from counter 4 and uses this to control the digital output to gain circuit 1. Hence, counter 4 and PROM 5 act as part of a feedback loop in the apparatus. Use of the apparatus will now be described in further detail.

A spare line containing no transmission data is detected in a raster scan of a video signal and the associated synchronization pulses are used to set up a gate period of approximately 64 microseconds in a manner well known in the art. During this gate period, the video signal is allowed to pass to the noise measuring apparatus. Signal $V_{in}$ is applied to gain circuit 1. As is shown in FIG. 2, gain circuit 1 may include a digital to analogue converter 7 and an analogue multiplier 8. An input signal B from PROM 5 is combined with reference signal Vrefl to apply an analogue signal X at one of the inputs to multiplier 8 which is proportional to B. The noise signal $V_{in}$ is combined and multiplied with signal X at multiplier 8 to give an output signal $V_{out}$ proportional to $V_{in}$ and B. In fact, $V_{out}$ is given by $$V_{out} = BV\text{refl}V_{in}/2^{n+1} \qquad (1)$$

where n is the number of bits, i.e, 12 in this case.

The gain circuit 1 may alternatively comprise a number of switch-in or bypass amplifiers, controlled by digital input B.

Signal $V_{out}$ is subsequently applied to r.m.s. to d.c. converter 2 where the true r.m.s. value $V_{r.m.s.}$ of the signal is obtained. Several commercial devices are available for such conversion and their structure will not be described in detail.

Given the short time available to obtain results using the apparatus, it has been found preferable to use a track and hold circuit 9 shown in FIG. 3, to allow the result to settle quickly and enable the converter not to have to start from 0v every time a measurement is made. Track and hold circuits are common in the art and will not be described in great detail. In the apparatus, a noise measurement enable signal 10 is supplied to the track and hold circuit at a suitable time when measurement is to be made. FIG. 4A shows a gated noise signal as is applied as input $V_{in}$ to the apparatus. FIG. 4B shows the noise measurement enable signal 10 which may be generated in response to the noise signal and may have a duration of, say, 60 microseconds. FIG. 4C shows a typical output signal $V_{r.m.s.}$ which may be derived from the r.m.s. to d.c. apparatus.

Referring again to FIG. 1, signal $V_{r.m.s.}$ from the r.m.s. to d.c. converter 2 is applied to the comparison circuit 3 where it is compared with an AGC reference. A difference signal is used to control the counter 4. This is an 8-bit up/down counter having fast count ability. If signal $V_{r.m.s.}$ is greater than $V_{ref}$ the counter 4 is controlled to count down and if $V_{r.m.s.}$ is less than $V_{ref}$ it is controlled to start counting up. The output from comparison circuit 3 is also checked to see whether it is also more than one decibel from the reference level. If this is so, then the fast/slow control in counter 4 is operative to clock the 5th bit of counter, 4 i.e, saving the time that would be required to clock through every single bit of the counter.

Line 11 from the comparison circuit 3 is used to control the up/down counter 4 and line 12 is the line on which the output from the comparison circuit 3 is checked to see whether it is more than one dB from $V_{ref}$.

Digital output from counter 4 is applied to PROM 5. This generates the antilog of the signal from counter 4 and applies the antilog data as feedback signal B to the gain circuit 1. In FIG. 1, feedback signal B is shown as a 12-bit digital signal $B_1$ to $B_{12}$. This feedback signal is used to alter the gain applied to the input noise signal, as shown and described with reference to FIG. 2 above.

The circuit is then looped again with the noise signal having new gain determined by the original feedback B. The circuit is continually looped with the counter counting up or down depending on whether the noise signal is less than or greater than $V_{ref}$ respectively. Each time the counter is clocked up or down a different feedback value is selected from PROM 5. The method is therefore one of 'trial and error' with the feedback being altered each cycle until equilibrium is achieved. At this point, an equilibrium state is achieved at which the output signal from the comparison circuit 3 will cause the counter to clock up or down on alternative measurements. Any changes in noise level will be tracked since the counter will count up or down to re-establish equilibrium.

At equilibrium, if the r.m.s. level of the noise is N, the measurement from counter 4 is D counts, and the antilog feedback signal is B, then $$N \times B = V_{ref}$$

i.e, $$N = V_{ref}/B$$

but $$B = \text{antilog } (D)$$

$$\log N = \log V_{ref}/B$$

$$\log N = \log (V_{ref}) - \log B$$

$$\log N = \log (V_{ref}) - \log (\text{antilog } (D))$$

hence $$\log N = \log (V_{ref}) - D \qquad (2)$$

This is a straight forward relationship and has the advantage that since the log of N is obtained, N is easily obtainable in decibels.

It is thus seen that the use of antilog feedback from PROM 5 in the present apparatus is advantageous. As stated above, the counter output is logarithmically related to the noise level and hence conversion to decibels requires only simple multiplication rather than calculation of the logarithm of each result.

At the extremes of very high and very low levels of noise, the digital gain required will deviate slightly from a simple linear scale. However, since the codes for the digital to analogue converter 7 are stored within PROM 5 it is a simple matter to accommodate such deviations by revising the data stored in the PROM, which could if necessary store values related to the antilog of the data signals rather than the antilogs themselves.

It will be appreciated that the PROM used in the above described apparatus may be replaced by a ROM containing the desired data.

I claim:

1. Signal measurement apparatus comprising: means for applying gain to an input signal to produce a resulting signal having a gained signal level; means for comparing the resulting signal with a known reference signal having a reference level and for producing an output indicative of the difference between them; and a feedback loop for altering the gain applied to the input signal, the feedback loop including (a) a counter receiving the output of the comparing means adapted to count up or down when the gained signal level is respectively lower or higher than the reference level and (b) a memory element for storing data indicative of values of a chosen transfer function, wherein a value is selected from the memory element according to the current count of the counter and the gain is altered by an amount related to the selected value; the apparatus being adapted to provide an output signal indicative of the count of the counter.

2. Apparatus as claimed in claim 1 further including means for gating an input signal such that the signal present on at least a portion of one chosen line of a video field may be periodically measured.

3. Apparatus as claimed in claim 2 further including an r.m.s. to d.c. converter in the input path to the comparing means.

4. Apparatus as claimed in claim 3 wherein the r.m.s. to d.c. converter includes a track and hold circuit.

5. Apparatus as claimed in claim 1 wherein the transfer function is an antilog function.

6. Apparatus as claimed in claim 1 wherein the memory element is any type of Read Only Memory or Random Access Memory.

7. Apparatus as claimed in claim 1 wherein the counter includes a fast/slow control adapted to clock the counter at a faster rate if the difference is greater than a chosen amount.

8. A method of signal measurement comprising the steps of: (a) applying gain to an input signal to produce a resulting signal having a gained signal level; (b) clocking a counter to count up or down if the gained signal level is respectively lower or higher than a known reference signal level to produce a count value; (c) using the count value to select a chosen value from a plurality of values indicative of a chosen transfer function stored in a memory element and applying the chosen value as a negative feedback signal to alter the gain; (d) repeating steps (a)–(c) until an equilibrium state is reached at which the gained signal level is substantially equal to the known reference signal level; and (e) deriving a value for the gained signal level of the input signal from the count value produced by the counter.

9. A method as claimed in claim 8 wherein the equilibrium state automatically alters to track changes in the input signal level.

10. A method as claimed in claim 8 wherein the input signal is a video signal gated such that at least a portion of one chosen line in each video field is periodically measured.

11. A method as claimed in claim 10 wherein the current value of the counter is held between the gated periods.

12. A method as claimed in claim 8 wherein the counter is clocked to count at a faster rate if the difference is greater than a chosen amount.

13. A method as claimed in claim 8 wherein the transfer function is an antilog function.

* * * * *